United States Patent [19]
Hawes

[11] Patent Number: 5,331,227
[45] Date of Patent: Jul. 19, 1994

[54] PROGRAMMABLE LOGIC DEVICE MACROCELL WITH AN EXCLUSIVE FEEDBACK LINE AND AN EXCLUSIVE EXTERNAL INPUT LINE

[75] Inventor: Mark A. Hawes, Boise, Id.

[73] Assignee: Micron Semiconductor, Inc., Boise, Id.

[21] Appl. No.: 166,662

[22] Filed: Dec. 13, 1993

Related U.S. Application Data

[63] Continuation of Ser. No. 883,076, May 15, 1992, abandoned.

[51] Int. Cl.[5] .......................................... H03K 19/173
[52] U.S. Cl. .................................. 307/465; 307/465.1
[58] Field of Search ................................. 307/465–469

[56] References Cited

U.S. PATENT DOCUMENTS

| | | | |
|---|---|---|---|
| 3,287,702 | 11/1966 | Borck, Jr. et al. . | |
| 3,287,703 | 11/1966 | Slotnick . | |
| 3,296,426 | 1/1967 | Bau . | |
| 3,313,926 | 4/1967 | Minnick . | |
| 3,423,646 | 1/1969 | Cubert et al. . | |
| 3,462,742 | 8/1969 | Miller et al. . | |
| 3,473,160 | 10/1969 | Wahestrom . | |
| 3,514,543 | 11/1970 | Crawford et al. | 340/324 |
| 3,535,498 | 10/1970 | Smith, Jr. . | |
| 3,566,153 | 2/1971 | Spencer, Jr. | 307/468 |
| 3,602,733 | 8/1971 | Aoki | 307/209 |
| 3,702,985 | 11/1972 | Probsting | 340/166 R |
| 3,737,866 | 6/1973 | Gruner | 340/172.5 |
| 3,742,292 | 2/1973 | Price | 307/209 |
| 3,757,306 | 9/1973 | Boone | 340/172.5 |
| 3,769,525 | 10/1973 | Foss et al. | 307/254 |
| 3,774,171 | 11/1973 | Regetz | 365/105 |
| 3,795,901 | 3/1974 | Boehm et al. | 340/172.5 |
| 3,798,606 | 3/1974 | Henle et al. | 340/172.5 |
| 3,803,587 | 4/1974 | Mead | 340/336 |
| 3,816,725 | 6/1974 | Greir | 364/716 |
| 3,818,252 | 6/1974 | Chuba et al. | 307/303 |
| 3,818,452 | 6/1974 | Greer | 340/825.83 |
| 3,832,489 | 8/1974 | Krushna | 178/71 |
| 3,849,638 | 11/1974 | Greer | 364/716 |
| 3,906,255 | 9/1975 | Mensch, Jr. | 307/448 |
| ',912,947 | 10/1975 | Buchanan | 307/269 |
| 3,924,243 | 12/1975 | Vermeulen | 364/900 |
| 3,967,059 | 6/1976 | Moore, III et al. | 178/58 |
| 3,974,366 | 8/1976 | Hebenstreit | 364/716 |
| 3,979,730 | 9/1976 | Bennett et al. | 364/200 |
| 3,983,538 | 9/1976 | Jones | 364/716 |
| 3,987,410 | 10/1976 | Beausoleil et al. | 340/146.3 |
| 3,990,045 | 11/1976 | Beausoleil et al. | 340/146.3 |
| 4,034,349 | 7/1977 | Momaco et al. | 364/200 |
| 4,034,356 | 7/1977 | Howley et al. | 340/173 |
| 4,037,089 | 7/1977 | Horninger | 235/152 |
| 4,044,312 | 8/1977 | D'Ortenfio | 328/165 |
| 4,078,259 | 3/1978 | Soulsby et al. | 364/900 |
| 4,091,359 | 5/1978 | Rossler | 340/166 R |
| 4,093,998 | 6/1978 | Miller | 364/900 |
| 4,107,785 | 8/1978 | Seipp | 364/900 |
| 4,124,899 | 11/1978 | Birkner et al. . | |
| 4,128,873 | 12/1978 | Lamlaux | 364/200 |
| 4,218,740 | 8/1980 | Bennett et al. | 364/200 |
| 4,422,072 | 12/1983 | Cavlan | 340/825.87 |
| 4,554,640 | 11/1985 | Wong et al. | 364/825.87 |
| 4,717,912 | 1/1988 | Hawey et al. | 340/825.87 |
| 4,742,252 | 5/1988 | Agrawae | 307/465 |
| 4,758,746 | 7/1988 | Birkner | 307/468 |
| 4,763,020 | 8/1988 | Takata et al. | 307/465 |
| 4,771,285 | 9/1988 | Agrawal et al. | 340/825.83 |
| 4,789,951 | 12/1988 | Birkner | 307/465 |
| 4,847,612 | 7/1988 | Kaplinsky | 340/825.800 |

(List continued on next page.)

OTHER PUBLICATIONS

J. E. Elliott, et al., "Away Logic Processing", IBM, Tech. Disclosure Bulletin, vol. 18, No. 21, Jul. 1973, pp. 219 & 220.

(List continued on next page.)

Primary Examiner—Edward P. Westin
Assistant Examiner—Andrew Sanders
Attorney, Agent, or Firm—Angus C. Fox, III

[57] ABSTRACT

A programmable logic device (PLD) output macrocell circuit is disclosed. Specifically, there is a macrocell having an exclusive logic signal feedback line and an exclusive external input signal line both feeding into the input of the PLD.

4 Claims, 3 Drawing Sheets

U.S. PATENT DOCUMENTS

| | | | |
|---|---|---|---|
| 4,879,481 | 11/1989 | Pathak | 307/465 |
| 4,918,641 | 4/1990 | Jigour et al. | 364/716 |
| 4,963,768 | 10/1990 | Agrawal et al. | 307/465 |
| 4,967,107 | 10/1990 | Kaplinsky | 307/465 |
| 5,012,135 | 4/1991 | Kaplinsky | 307/465 |
| 5,027,011 | 6/1991 | Steele | 307/465 |
| 5,027,315 | 6/1991 | Agrawal et al. | 364/900 |
| 5,028,821 | 7/1991 | Kaplinsky | 307/465 |
| 5,055,718 | 10/1991 | Galbraith et al. | 307/465 |
| 5,059,828 | 10/1991 | Tanagawa | 307/465 |
| 5,121,006 | 6/1992 | Pedusen | 307/465 |
| 5,136,188 | 8/1992 | Hu et al. | 307/465 |
| 5,148,391 | 9/1992 | Zagar | 365/96 |
| 5,166,556 | 11/1992 | Hsu et al. | 307/465 |
| 5,168,177 | 12/1992 | Shankar et al. | 307/465 |

OTHER PUBLICATIONS

H. Fleisher, et al., "Reconfigurable Machine", IBM Tech. Disclosure Bulletin, vol. 16, No. 10 Mar. 1974, pp. 221, 222 & 223.

H. Flersher et al., "An Introduction to Array Logic", IBM J. Research & Development, Mar. 1975 pp. 98–104.

Jones, "Array Logic Macros", IBM J. Research and Development Mar. 1975 pp. 120–126.

Andres, "MOS Programmable Logic Arrays", A Tevga Instrument Application Report Oct. 1970, pp. 1–13.

Barns et al., Integrated Circuits in Digital Electronics John Wiley & Sons 1973, pp. 412–419 and 84–91 and FIGS. 11–34.

Wood "High-Speed Dynamic Programmable Logic Array Chip", IBM J. Res. Develop. Jul. 1975, pp. 379–381.

Bousel, "Memory on a Chip: a step toward large scale Integration", Electronics, Feb. 6, 1967 pp. 93–97.

Wilkes, et al., "The design of the control unit of an Electronic Digital Computer", The Institution of Electrical Engineers, Jun. 1957, pp. 121–128.

Mrazek, "PLAs Replace ROMs for Logic Designs", Electronic Design Oct. 25, 1973 pp. 66–70.

Howley et al., "Programmable Logic Array Decoding Technique", IBM Tech. Disclosure Bulletin, vol. 17 No. 10 Mar. 1975 p. 2988.

Hemel, "The PLA: a different load of ROM", Electronic Design, Jan. 5, 1976 pp. 78–84.

Kidder, The Soul of a New Machine, 1982 pp. 118–128 and 268–269.

National Semiconductor Inc. "Data Update MOS", Aug. 1972, pp. 86 and 87.

Blakeslee, Digital Design with Standard MSI and LSI, John Wiley and Sons, 1975, pp. 67–77, 94–99, and 104–105.

PAL Handbook, Monolithic Memones, Inc. 1978.

Hutton et al., "A Simplified Summation Array for Cellular Logic Modules", IEEE Trans. on Computers, Feb. 1974 pp. 203–206.

Programmable Logic—A Basic Guide for the Designer, Data I/O Corp. 1983–pp. 20–25.

The TTL Data Book For Design Engineers, Texas Instruments Inc., 1973, pp. 295, 303, 473, 458 and 480.

Monolethic Memones Inc. Form 10-K, Oct. 3, 1982 Annual Report Pursuant to Section 13 or 15 (2) of the Securities Exchange Act of 1934.

"The Role of Software in the growth of PLDs", The Technology Research Group Letter, vol. 1 No. 13, Nov. 1985 p. 3.

Teil et al.,"A Logic Minimizer for KLSI PLA Design-"ACM IEEE Ninteenth Design Automation Conf. Proceedings, Jun. 82, pp. 156–162.

Marrin, "Programmable Logic Devices Gain Software Support", EDN Feb. 9, 1984, pp. 67–74.

Monolithic Memones Annual Report 1981, Letter to Shareholders p. 2.

"Semicustom IC Update, Field Programmable Logic Services", Visa from the Valley, Hambrecht & Grist Inc. vol. 3 No. 1, Mar. 1986, pp. 4–7.

Philips Institutional Research Report on Monolithic Memones, Inc. A publication of Woodman, Kirkpatrick & Gilbrath Aug. 30, 1984.

Wood, "High-Speed Dynamic Programmable Logic Array Chip", IBM J. Res. Develop. Jul. 1975, pp. 379–381.

Cavlan et al., "Field PLAS Simplify Logic Designs", reprinted from Electronic Design, Sep. 1, 1975.

Signetics, Bipolar and MOS Memory Data Manual Signetics Inc. pp. 156–165 Jan. 1979.

Dorman "PLSA on MPs at times they compete at time they cooperate", Electronic Design, 18 Sep. 1, 1976, pp. 24–30.

Eliot et al., "Array Logic Processing", IBM Tech. Disclosure Bulletin, vol. 16, No. 2 Jul. 1973 pp. 586–587.

Mac World, The Macintoch Magazine, May–Jun. 1984.

Use of Laser mechanism in printers breaks Price and Maintenance Barriers, Jan. 15, 1985 p. 277.

PROGRAMMABLE LOGIC DEVICE MACROCELL WITH AN EXCLUSIVE FEEDBACK LINE AND AN EXCLUSIVE EXTERNAL INPUT LINE

This application is a continuation of application Ser. No. 07/883,076 filed on May 15, 1993, now abandoned.

CROSS-REFERENCE TO RELATED AND COPENDING APPLICATIONS

U.S. Pat. application Ser. No. 07,817,167, filed Jan. 6, 1992, is a CMOS logic cell for high-speed, zero-power programmable array logic devices, having common assignee with the present invention.

U.S. Pat. application Ser. No. 07/865,007, filed Apr. 8, 1992, is a field programmable logic array with speed optimized architecture, having common assignee with the present invention.

U.S. Pat. application Ser. No. 07/884,104, filed May 15, 1992, is a field programmable logic array with two OR planes, having common assignee with the present invention.

U.S. Pat. application Ser. No. 07/884,489, filed May 15, 1992, is a programmable logic device macrocell with two or array inputs, having common assignee with the present invention.

U.S. Pat. application Ser. No. 07/883,759, filed May 15, 1992, is a programmable logic device with a single parameter state decode, having common assignee with the present invention.

U.S. Pat. application Ser. No. 07/844,505, filed May 15, 1992, programmable logic device macrocell with an exclusive feedback line and an exclusive external input line for a combinatorial mode and accommodating two separate programmable or planes.

U.S. Pat. application Ser. No. 07/883,843, filed May 15, 1992, programmable logic device macrocell with an exclusive feedback line and an exclusive external input line for a state counter or registered sum-of-products signal.

U.S. Pat. application Ser. No. 07/883,078, filed May 15, 1992, programmable logic device macrocell with an exclusive feedback line and an exclusive external input line for registered and combinatorial modes using a dedicated product term form control.

FIELD OF THE INVENTION

The present invention relates to field programmable logic arrays (FPLA); particularly, an FPLA having macrocells that contains a faster and exclusive feedback line as well as an exclusive external-input line from an input/output (I/O) pad.

BACKGROUND OF THE INVENTION

The introduction of programmable logic devices (PLDs) was a true revolution in the hardware design world. It enabled engineers to shrink circuits requiring several devices onto a single device thus simplifying their designs while saving space and power. Traditionally, PLDs have been used in combinational circuits such as address decoders as well as sequential circuits such as bus arbitration schemes. During the last few years, advances and improvements in PLD architectures enabled the devices to grow more complex while addressing the never-ending quest for higher density and faster speeds. Despite these improvements, engineers still face certain problems and limitations when implementing state machine designs with PLDs.

A typical programmable logic device is composed of a user-programmable AND array, a fixed or programmable OR gate or array, followed by a macrocell comprising output registers, a feedback path to the programmable AND array, and output pads. The existence of a feedback path from the output registers or buffers to the AND array makes PLDs ideal candidates for state machine implementations.

Although the feedback paths allow for architecture that implements state machines these architectures have been encumbered with inefficient feedback paths. Specifically, these paths have incorporated unnecessary gate delays like three-states or registers.

For example, FIG. 1, is a related design which implements an inefficient feedback path. Particularly, while in an output mode, programmable logical OR array 10 couples signals to three-state (output buffer) 12 where signals are coupled to output pad 14 and input buffer 16 via feedback line 18.

One skilled in the art will understand that a three-state, such as 12, has a relatively large signal delay and creates a large amount of signal noise. Additionally, it is easily noted that there is no exclusive feedback line, but a sharing of the feedback and input line.

Therefore, a need exists for a macrocell which has an efficient feedback path, yet provides for an input line from the I/O pad. Particularly, a feedback path which avoids costly timing delays and unnecessary signal noise being injected (returned) into the logic array.

SUMMARY OF THE INVENTION

One skilled in the art will appreciate the advantage of the subject macrocell architecture. Specifically, there is an integrated circuit which has a feedback path which avoids the timing delays and unnecessary signal noise emanating from the use of a 3-state device. Clearly, providing an exclusive logic signal feedback line to the logic circuitry and providing an exclusive external signal input line to the logic circuitry will solve the subject problems.

Features of the present invention will become clear from the following detailed description of the invention, taken in conjunction with the accompanying drawings.

DETAILED DESCRIPTION OF THE ILLUSTRATED EMBODIMENT

Incorporated Material

For the purpose of providing background material which may in some respects illustrate the state of the art, the following books are herein incorporated by reference: "Programmable Logic Handbook," fourth edition, by Monolithic Memories Inc., 2175 Mission College Blvd., Santa Clara, Calif.; and "Practical Design Using Programmable Logic," by D. Pellerin and M. Holley, Prentice Hall, library of Congress no. TK7872 .L64 P44 1991.

The following U.S. patents are herein incorporated by reference: U.S. Pat. No. 3,423,646, is a computer logic device consisting of an array of tunneling diodes, isolators and short circuits. U.S. Pat. No. 3,566,153, is a programmable sequential logic device. U.S. Pat. No. 4,124,899, is a programmable array logic circuit. U.S. Pat. No. 4,717,912, an apparatus for producing any one of a plurality of signals at a single output. U.S. Pat. No. 4,758,746, is a programmable logic array with added array of gates and added output routing flexibility.

Definitions

A macrocell is generally defined as an output circuitry coupled to the end of a logic circuitry—such as a logical OR array—and containing multiplexers, buffers, drivers, registers, etc., and sometimes an input/output pad. External inputs terminology is used to describe the fact that the I/O pad allows for input signals from an external source.

Specific Embodiment

Figure 1:
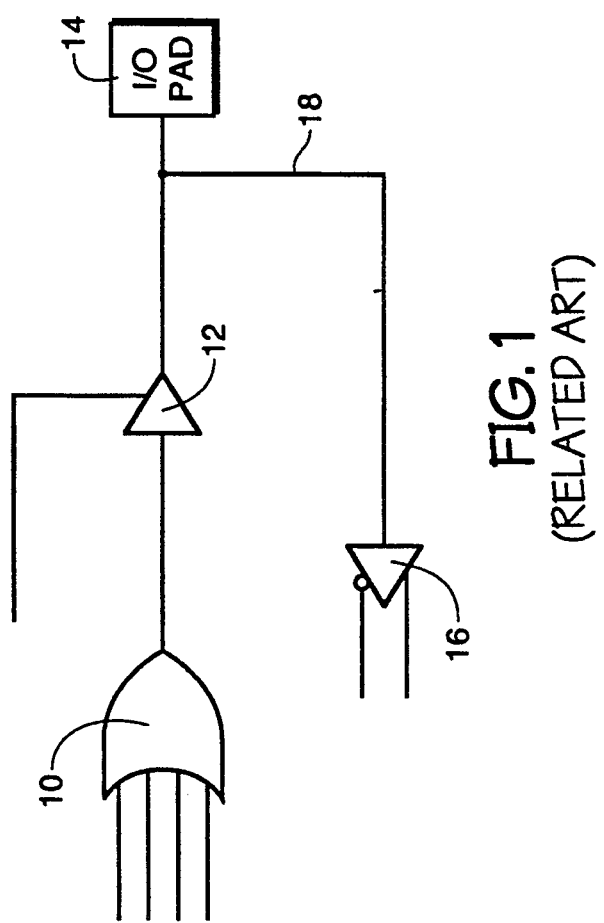
FIG. 1 illustrates a related art macrocell architecture.
Figure 2:
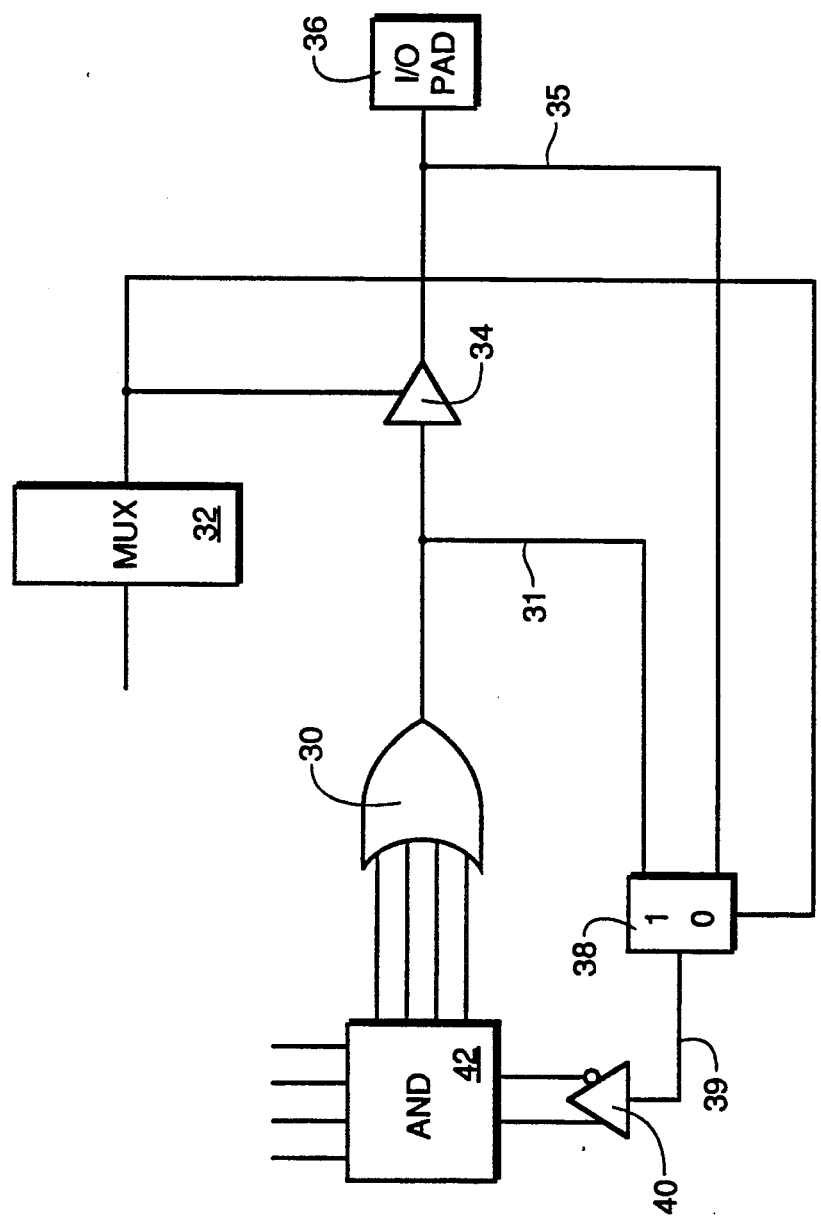
FIG. 2 is a detailed illustration of the invention.

FIG. 2 is a detailed illustration of the invention and includes the following elements: programmable logical OR array 30, exclusive feedback line 31, three-state (3-state) 34, multiplexer (mux) 32, input/output (I/O) pad 36, exclusive exterior signal input line 35, multiplexer (mux) 38, AND array input line 39 (also referred to as logic circuitry input line), AND array input buffer 40, and logical programmable AND array 42. Note, that AND and OR arrays make up what can be called a logic circuit.

One skilled in the art will appreciate the operation of the invention. Specifically, there are two primary modes for the macrocell circuit. The first mode occurs when mux 32 enables 3-state 34 to allow outputting of logic signals from the logic circuitry (arrays 30 and 42) over I/O pad 36. Simultaneously, in this first mode, mux 32 also programs or sets mux 38 to a "1" which selects the exclusive logic signal feedback line 31, thus allowing feedback logic signals to be coupled to logic circuit input line 39.

The second mode of the macrocell occurs when mux 32 disables three-state 34. Disabling allows for external signals to be inputted over I/O pad 36. Simultaneously, mux 32 also programs or sets mux 38 to a "0" which then only allows signals from exclusive exterior input line 35 to proceed over array input line 39 and to array input buffer 40.

Figure 3:
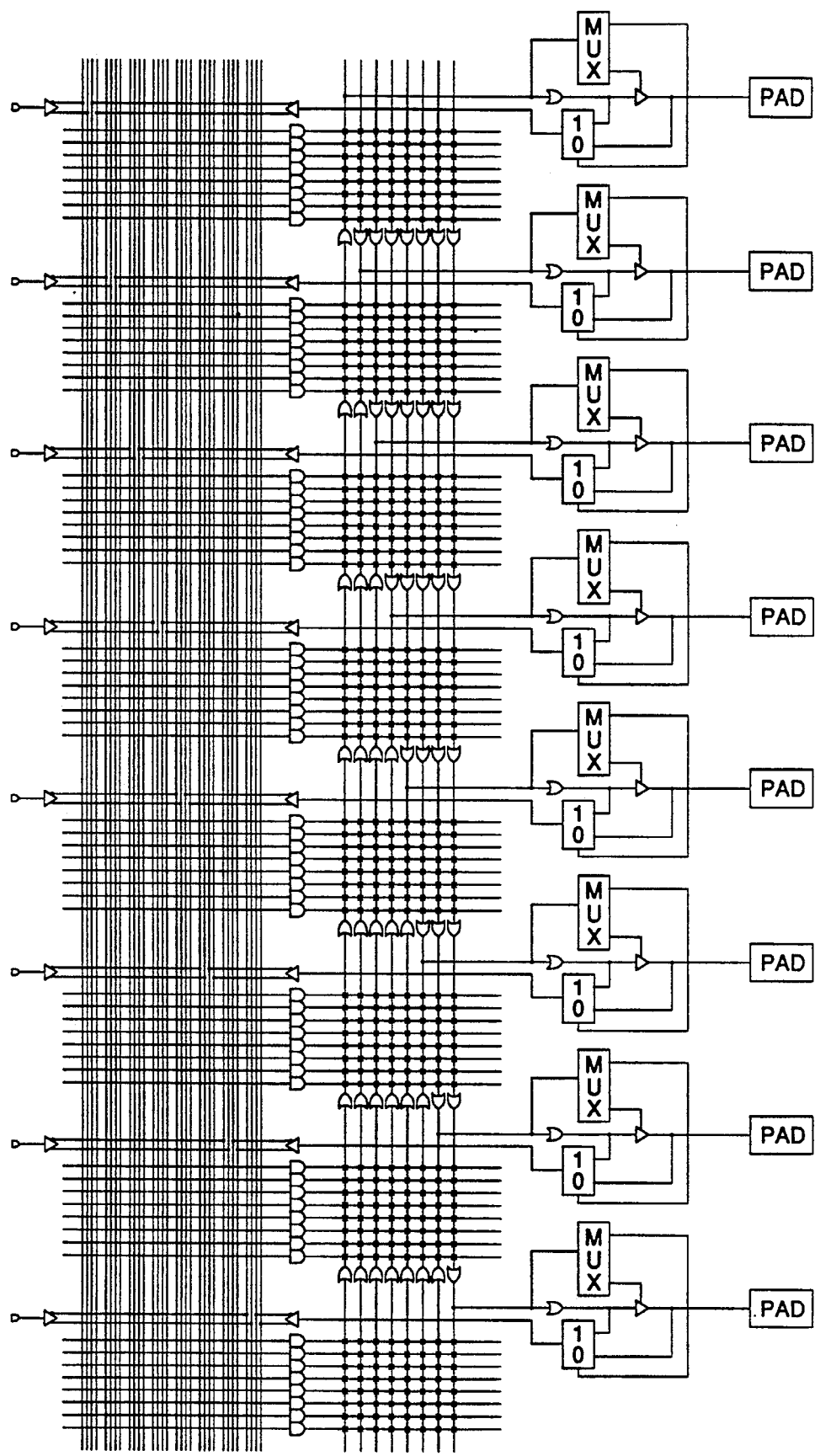
FIG. 3 is a detailed illustration of an embodiment of the present invention utilized in a field programmable logic device.

FIG. 3 illustrates one embodiment of the invention being utilized in a field programmable logic device having programmable AND and OR arrays.

Variations in the Invention

There are several obvious variations to the broad invention and thus come within the scope of the present invention. Uniquely, there are other means for driving mux 38, like sum of product terms from the logical OR, or signals from other macrocells on the chip. Additionally, this invention will work on any IC utilizing I/O and feedback lines.

While the invention has been taught with specific reference to one embodiment, someone skilled in the art will recognize that changes can be made in form and detail without departing from the spirit and the scope of the invention.

Although subheadings in the Detailed Description of the Illustrated Embodiment are used, these are merely provided for assisting the reader; wherein, the writer is free to enter any information under any heading/s.

I claim:

1. A field programmable logic device (FPLD), comprising:
   a) means, having an input and output, for creating a sum-of-products signal on its output;
   b) an I/O pad, having:
      b1) an input for receiving the sum-or-products signal and outputting it from the FPLD, and
      b2) an output for receiving external signals, from outside of the FPLD, and inputting them;
   c) first switching means,
      having an input that is coupled exclusively and directly to the output of the creating means and an output coupled directly to the I/O pad,
      for initiating a stopping mode that prevents the sum-of-products signal from reaching the I/O pad, and
      for initiating an allowing mode that allows the sum-of-products signal to proceed to the I/O pad and be output from the FPLD;
   d) internal feedback means,
      coupled at one end exclusively and directly 1) to the output of the creating means, and 2) to the input to the first switching means,
      for feeding back the sum-of-products signal to the input of the creating means;
   e) external feedback means,
      coupled at one end exclusively and directly 1) to the output of the first switching means, and 2) to the input to the I/O pad,
      for feeding back the external signals, received from the I/O pad, to the input of the creating means;
   f) second switching means,
      coupled directly to external feedback means to receive the external signals from the external feedback means, and
      coupled directly to the internal feedback means to receive the sum-of-products signals from the producing means,
      for initiating a stopping mode that prevents the sum-of-products signal from reaching the input of the producing means, but allows the external signal to reach the input of the producing means, and
      for initiating an allowing mode that allows the sum-of-products signal to proceed to the input of the producing means, but stops the external signal from reaching the input of the producing means; and
   g) control means,
      coupled directly to the first and second switching means,
      for initiating stopping and allowing modes of the first and second switching means.

2. A programmable logic device (PLD), consisting of:
   a) means, having an input and output, for creating a sum of products signal on its output;
   b) an I/O pad, having:
      b1) an input for receiving the sum-or-products signal and outputting it from the PLD, and
      b2) an output for receiving external signals, from outside of the FPLD, and inputting them;
   c) first switching means,
      having an input that is coupled exclusively and directly to the output of the creating means and an output coupled directly to the I/O pad, for initiating a stopping mode that prevents the sum-of-products signal from reaching the I/O pad, and for initiating an allowing mode that allows the sum-of-products signal to proceed to the I/O pad and be output from the PLD;

d) internal feedback means, coupled at one end exclusively and directly 1) to the output of the creating means, and 2) to the input to the first switching means, for feeding back the sum-of-products signal to the input of the creating means;

e) external feedback means, coupled at one end exclusively and directly 1) to the output of the first switching means, and 2) to the input to the I/O pad, for feeding back the external signals, received from the I/O pad, to the input of the creating means;

f) second switching means, coupled directly to external feedback means to receive the external signals from the external feedback means, and coupled directly to the internal feedback means to receive the sum-of-products signals from the producing means, for initiating a stopping mode that prevents the sum-of-products signal from reaching the input of the producing means, but allows the external signal to reach the input of the producing means, and for initiating an allowing mode that allows the sum-of-products signal to proceed to the input of the producing means, but stops the external signal from reaching the input of the producing means; and g) control means, coupled directly to the first and second switching means, for initiating stopping and allowing modes of the first and second switching means.

3. A PLD, comprising:

a) an AND array, being programmable, for creating product signal terms;

b) an OR array, being programmable, receiving a portion of said product signal terms, and thereby creating a sum-of-products signal term that is outputted over a single output line;

c) an input/output pad having an input line receiving signal terms from the OR array and having an output line for outputting those signals; and d) a macrocell means consisting of:

d1) gating means, directly receiving OR array signal output line, 1) for, first, gating the sum-of-products signal term, and sending the signal term directly to the input line of the input/output pad, and 2) for, second, gating to prevent the sum-of-products signal term from reaching the input line to the input/output pad;

d2) an exclusive external signal input line for routing signals, external to the FPLD, to the AND array when the FPLD is in the first gating; whereupon this in turn allows for an external signal to be routed into the programmable logic device over the input/output pad and along an exclusive input line, d3) feedback gating means, coupled to receive the external signal and the first sum-of-products signal, and for gating either the external or sum-of-products signal to an input to the AND array;

d4) enable means, having; 1) a first output signal coupled to the gating means, and, 2) the same first output signal coupled to the feedback gating means, for enabling or disabling the gating means, and for enabling or disabling the feedback gating means to determine if the first sum-of-product signal or that an external signal will be fed back to the AND array.

4. A PLD, comprising:

a) an AND array, being programmable, for creating product signal terms;

b) an OR array, being programmable, receiving a portion of said product signal terms, and thereby creating a sum-of-products signal term that is outputted over a single output line;

c) an input/output pad having an input line receiving signal terms from the OR array and having an output line for outputting those signals; and d) a macrocell means consisting essentially of:

d1) gating means (34), directly receiving OR array signal output line;

1) for, first, gating the sum-of-products signal term, and sending the signal term directly to the input line of the input/output pad, and 2) for, second, gating to prevent the sum-of-products signal term from reaching the input line to the input/output pad;

d2) an exclusive external signal input line for routing signals, external to the FPLD, to the AND array when the FPLD is in the first gating;

whereupon this in turn allows for an external signal to be routed into the programmable logic device over the input/output pad and along an exclusive input line;

d3) feedback gating means, coupled to receive the external signal and the first sum-of-products signal for gating either the external or sum-of-products signal to an input to the AND array; and d4) enable means, having: 1) a first output signal coupled to the gating means, and, 2) the same first output signal coupled to the feedback gating means, for enabling or disabling the gating means; and for enabling or disabling the feedback gating means to determine if the first sum-of-products signal or that an external signal will be fed back to the AND array.

* * * * *